(12) United States Patent
Sung

(10) Patent No.: US 6,711,077 B2
(45) Date of Patent: Mar. 23, 2004

(54) WAFER BURN-IN TEST AND WAFER TEST CIRCUIT

(75) Inventor: Ha Min Sung, Chungcheongbuk-do (KR)

(73) Assignee: Hynix Semiconductor Inc., Ich'on (KR)

( * ) Notice: Subject to any disclaimer, the term of this patent is extended or adjusted under 35 U.S.C. 154(b) by 0 days.

(21) Appl. No.: 10/412,268

(22) Filed: Apr. 14, 2003

(65) Prior Publication Data

US 2003/0210589 A1 Nov. 13, 2003

Related U.S. Application Data

(62) Division of application No. 10/032,016, filed on Dec. 31, 2001, now Pat. No. 6,570,796.

(30) Foreign Application Priority Data

Sep. 20, 2001 (KR) ........................................ 2001-58151

(51) Int. Cl.$^7$ ................................................. G11C 7/00
(52) U.S. Cl. ............... 365/201; 365/225.7; 365/189.02; 365/189.05
(58) Field of Search ........................... 365/201, 189.02, 365/189.05, 225.7; 257/50, 530

(56) References Cited

U.S. PATENT DOCUMENTS

| 5,444,012 | A |   | 8/1995  | Yoshizumi et al. |
|-----------|---|---|---------|------------------|
| 5,471,429 | A | * | 11/1995 | Lee et al. .................... 365/201 |
| 5,506,499 | A |   | 4/1996  | Puar |
| 6,240,033 | B1| * | 5/2001  | Yang et al. ............... 365/225.7 |

FOREIGN PATENT DOCUMENTS

| JP | 10-253717  | 9/1998  | ............ G01R/31/28 |
| JP | 11-163067  | 6/1999  | ............ H01L/21/66 |
| JP | 00/138250  | 5/2000  | ............ H01L/21/60 |
| JP | 00-311500  | 11/2000 | ............ G11C/29/00 |

* cited by examiner

*Primary Examiner*—Connie C. Yoha
(74) *Attorney, Agent, or Firm*—Jacobson Holman PLLC

(57) ABSTRACT

A wafer burn-in test and a wafer test circuit for a semiconductor memory device which can cut down packaging expenses and improve F/T yield by performing a wafer burn-in test by using a pad for contact in a probe test of a wafer state.

1 Claim, 5 Drawing Sheets

WAFER BURN-IN TEST AND WAFER TEST CIRCUIT

This is a divisional application of prior application Ser. No. 10/032,016 filed Dec. 31, 2001, now U.S. Pat. No. 6,570,796.

BACKGROUND OF THE INVENTION

1. Field of the Invention

The present invention relates to a wafer burn-in test and a wafer test circuit for a semiconductor memory device using a probe pad for contact, and in particular to a wafer burn-in test and a wafer test circuit which can cut down packaging expenses and improve F/T yield by performing a wafer burn-in test by using a pad for contact in a probe test of a wafer state.

2. Description of the Background Art

In general, a screening test is performed to identify a DRAM having a defect at an early stage. The screening test mostly employs a burn-in test mode (a high temperature high voltage operation test). The burn-in test operation exposes a potential defect in the DRAM in a short time by operating the DRAM in the worst conditions such as at a high temperature and a high voltage. In the burn-in test operation, an appropriate stress voltage, especially an accelerating stress voltage, is applied to the respective units of the chip to detect the defect.

The burn-in test operation is used not only for the DRAM but also for the other semiconductor memory devices. An internal power circuit for generating an internal power voltage Vint to the DRAM adjusts the internal voltage so that an internal circuit cannot receive an excessive stress voltage in the burn-in test operation, and thus applies only a stress voltage for screening thereto.

Generally, actual contact with the semiconductor memory device using a probe pad for contact is performed after a probe test of a wafer state and before packaging. Accordingly, when an inferior chip is not sufficiently screened in the probe test, if a defect occurs after packaging, the chip cannot be repaired. In order to solve the foregoing problem, the wafer burn-in test is executed in the wafer state before packaging.

FIG. 1 is a block diagram illustrating a conventional wafer burn-in test circuit including a first probe pad unit 1 for contact, a second probe pad unit 2 for contact, a first buffer unit 3, a second buffer unit 4, a decoder unit 5, a data multiplexer unit 6, a test mode block unit 7 and an array control unit 8.

The first buffer unit 3 converts a signal BOP0IN inputted through the first probe pad unit 1 for contact into a CMOS level, and the second buffer unit 4 converts a signal BOP1IN inputted through the second probe pad unit 2 for contact into a CMOS level.

The decoder unit 5 receives the signals BOP0 and BOP1 from the first and second buffer units 3 and 4, and generates a control signal BPX<0:1>. The data multiplexer unit 6 inputs/outputs a desired data bit based on the control signal BPX<0:1> from the decoder unit 5.

The test mode block unit 7 generates a control signal TBIN<0:1> in the wafer burn-in test mode. The array control unit 8 controls bit lines, word lines and plate lines making up an access transistor (not shown) of a memory cell based on the control signal TBIN<0:1> from the test mode block unit 7, thereby applying a stress voltage to the cell, bit line and storage node.

FIG. 2 is a circuit diagram illustrating the first buffer unit 3 of FIG. 1. The first buffer unit 3 includes: a PMOS transistor MP1 for transmitting a power voltage VDD to a node Nd1 based on a power-up signal PUPB; a PMOS transistor MP2 for transmitting the power voltage VDD to the node Nd1 based on an initialization signal IDL; a PMOS transistor MP3 for transmitting the power voltage VDD to the node Nd1 based on a ground voltage VSS; a PMOS transistor MP4 for transmitting the signal of the node Nd1 to a node Nd2 transmitting the signal BOP0IN from the first probe pad unit 1 based on the ground voltage VSS; an inverter IV2 for receiving the signal of the node Nd2, and outputting an inverted signal to a node Nd3; a PMOS transistor MP5 for transmitting the power voltage VDD to the node Nd2 based on the signal of the node Nd3; and an inverter IV3 for receiving the signal of the node Nd3, and outputting an inverted signal BOP0.

When the power-up signal PUPB has a high state, the power voltage VDD is supplied to the node Nd1 through the PMOS transistors MP1 and MP3, and the signal of the node Nd1 is transmitted to the node Nd2 through the PMOS transistor MP4. Therefore, the signal BOP0IN of the node Nd2 has a high state during the power-up operation, and the output signal BOP0 has a high state. That is, the first buffer unit 3 maintains the initial state during non-contact by the first probe pad unit 1.

The second buffer unit 4 of FIG. 1 has the same constitution and operation as the first buffer unit 3 of FIG. 2. Accordingly, the input signal BOP1IN of the second buffer unit 4 has a high state during the power-up operation, and the output signal BOP1 has a high state. Identically, the second buffer unit 4 serves to maintain the initial state during non-contact by the second probe pad unit 2.

FIG. 3 is a circuit diagram illustrating the decoder unit 5 of FIG. 1. The decoder unit 5 includes: an inverter IV10 for receiving the output signal BOP0 from the first buffer unit 3, and outputting an inverted signal; an inverter IV20 for receiving the output signal BOP1 from the second buffer unit 4, and outputting an inverted signal; an inverter IV30 for receiving the output signal from the inverter IV20, and outputting an inverted signal; a NAND gate ND for receiving the output signals from the inverters IV10 and IV20; inverters IV50 and IV60 connected in series, between an output node Nd30 of the NAND gate ND and a node Nd40 transmitting a control signal BPX8; a NOR gate NR for receiving the output signal from the NAND gate ND and the output signal from the inverter IV20, and outputting a control signal BPX4; and an inverter IV40 connected between an output node Nd20 of the inverter IV30 and a node Nd50 transmitting a control signal BPX16.

When the input signal BOP0 from the first buffer unit 3 and the input signal BOP1 from the second buffer unit 4 have a low state, the output signal BPX8 has a high state, the output signal BPX4 has a low state, and the output signal BPX16 has a high state. When the input signal BOP0 and the input signal BOP1 have a high state, the output signal BPX8 has a high state, the output signal BPX4 has a low state, and the output signal BPX16 has a low state. When the input signal BOP0 has a low state and the input signal BOP1 has a high state, the output signal BPX8, the output signal BPX4 and the output signal BPX16 have a low state. When the input signal BOP0 has a high state and the input signal BOP1 has a low state, the output signal BPX8 has a high state, the output signal BPX4 has a low state, and the output signal BPX16 has a high state.

The data multiplexer unit 6 controls input/output of a desired data bit based on the output signal BPX<0:1> from the decoder unit 5.

However, the conventional wafer burn-in test circuit has a disadvantage in that, although the number of prober pins for the wafer burn-in test is reduced in using the probe pad for the wafer burn-in test, the chip area is increased due to the probe pad. Moreover, since address information is required for the wafer burn-in test in the test mode using an address key, the number of the prober pins for the test is increased, thereby increasing the prober production cost and the setting time before the test.

SUMMARY OF THE INVENTION

Accordingly, it is an object of the present invention to provide a wafer burn-in test and a wafer test circuit which can cut down packaging expenses, improve F/T yield and reduce the production cost, by screening an inferior chip before packaging by executing a wafer burn-in test with a fuse and a probe pad for contact prior to the contact.

In order to achieve the above-described object of the invention, there is provided a wafer test circuit including: a buffer unit for initializing an input signal inputted through a probe pad unit having a floating state during non-contact before blowing a wafer, converting the signal into a CMOS level, and outputting the converted signal; a fuse unit for generating a first control signal for selecting a signal generation path for the test operation of a wafer state before blowing the wafer, and a signal generation path for the operation of a bit line after blowing the wafer; a multiplexer unit for receiving the first control signal from the fuse unit and the output signal from the buffer unit, generating a second control signal for the wafer test operation before blowing the wafer, and generating a third control signal for the operation of the bit line after blowing the wafer based on the first control signal; and a decoder unit for receiving the output signal from the multiplexer unit, and generating a decoded signal.

In another aspect of the present invention, a wafer test circuit includes: a first buffer unit for initializing an input signal inputted through a probe pad unit having a floating state during non-contact before blowing a wafer, converting the signal into a CMOS level, and outputting the converted signal; a fuse unit for generating a first control signal for selecting a signal generation path for the test operation of a wafer state before blowing the wafer, and a signal generation path for the operation of a bit line after blowing the wafer; a multiplexer unit for receiving the first control signal from the fuse unit and the output signal from the first buffer unit, generating a second control signal for the wafer test operation before blowing the wafer, and generating a third control signal for the operation of the bit line after blowing the wafer based on the first control signal; and a second buffer unit for receiving the output signal from the multiplexer unit, and generating a buffered signal.

In still another aspect of the present invention, a wafer burn-in test circuit includes: first and second probe pad units having a floating state before blowing a wafer; a first buffer unit for initializing a signal from the first probe pad unit in a power-up operation based on a power-up signal, converting the signal into a CMOS level, and outputting the converted signal; a second buffer unit for initializing a signal from the second probe pad unit during the power-up operation based on the power-up signal, converting the signal into a CMOS level, and outputting the converted signal; a fuse unit for generating a first control signal for selecting a signal generation path for a burn-in test operation of a wafer state before blowing the wafer, and a signal generation path for the operation of a bit line after blowing the wafer; a decoder and multiplexer unit for receiving the first control signal from the fuse unit and the output signals from the first and second buffer units, generating a second control signal for the wafer test operation before blowing the wafer, and generating a third control signal for the operation of the bit line after blowing the wafer based on the first control signal; a test mode block unit for generating a fourth control signal in the wafer burn-in test mode based on the second control signal from the decoder and multiplexer unit; an array control unit for controlling bit lines, word lines and plate lines making up an access transistor of a memory cell based on the fourth control signal from the test mode block unit, and applying a stress to the cell, bit line and storage node; and a data multiplexer unit for controlling input/output of a desired data bit based on the third control signal from the decoder and multiplexer unit.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

Figure 1:
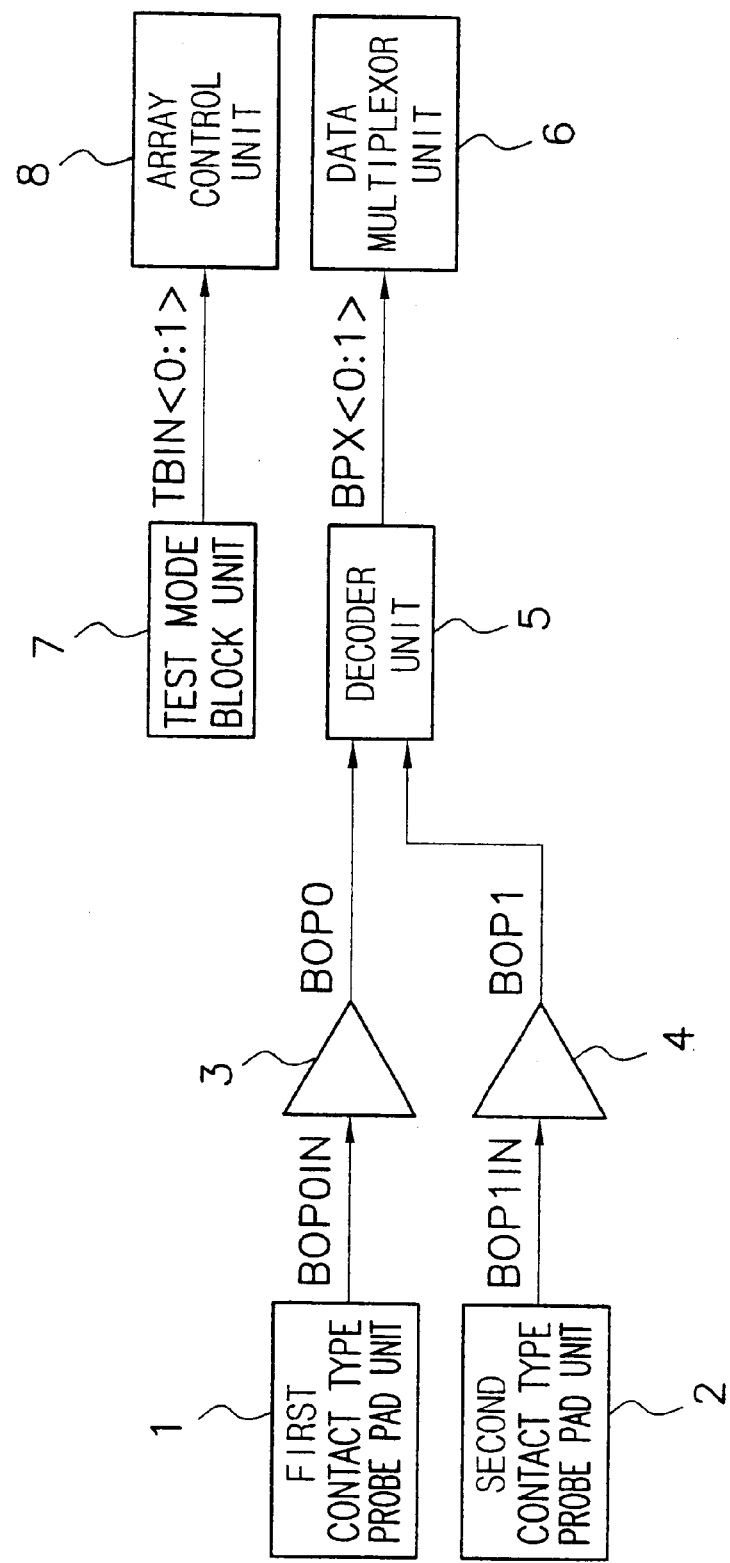
FIG. 1 is a block diagram illustrating a conventional wafer burn-in test circuit.
Figure 2:
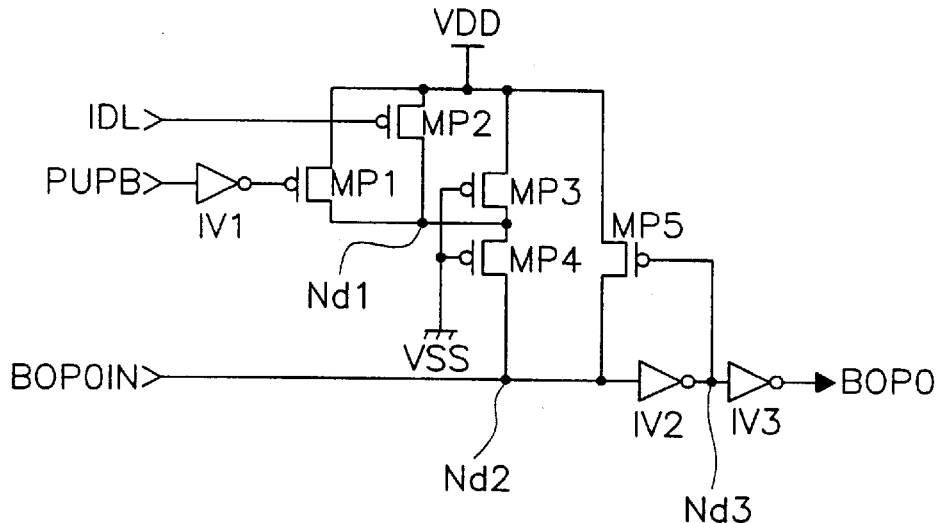
FIG. 2 is a circuit diagram illustrating a buffer unit of the circuit of FIG. 1.
Figure 3:
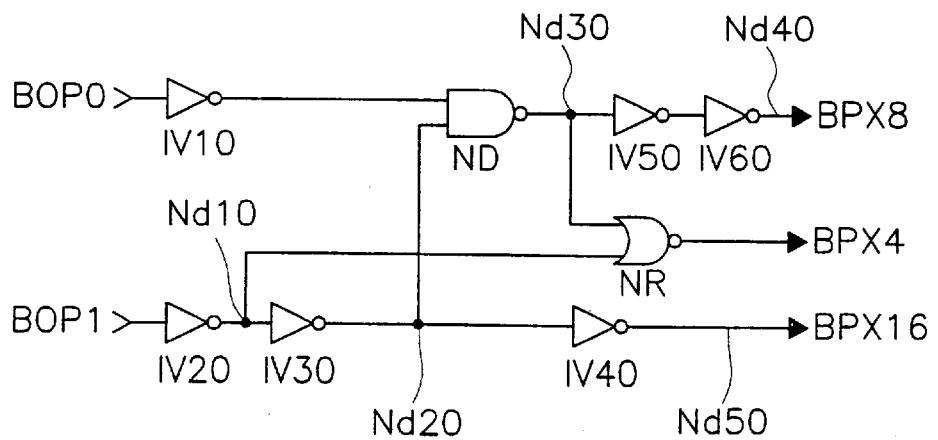
FIG. 3 is a circuit diagram illustrating a decoder unit of the circuit of FIG. 1.

A wafer burn-in test circuit and a wafer test circuit in accordance with a preferred embodiment of the present invention will now be described in detail with reference to the accompanying drawings.

In the following description, same drawing reference numerals are used for the same elements even in different drawings, and explanations thereof will be omitted.

Figure 4:
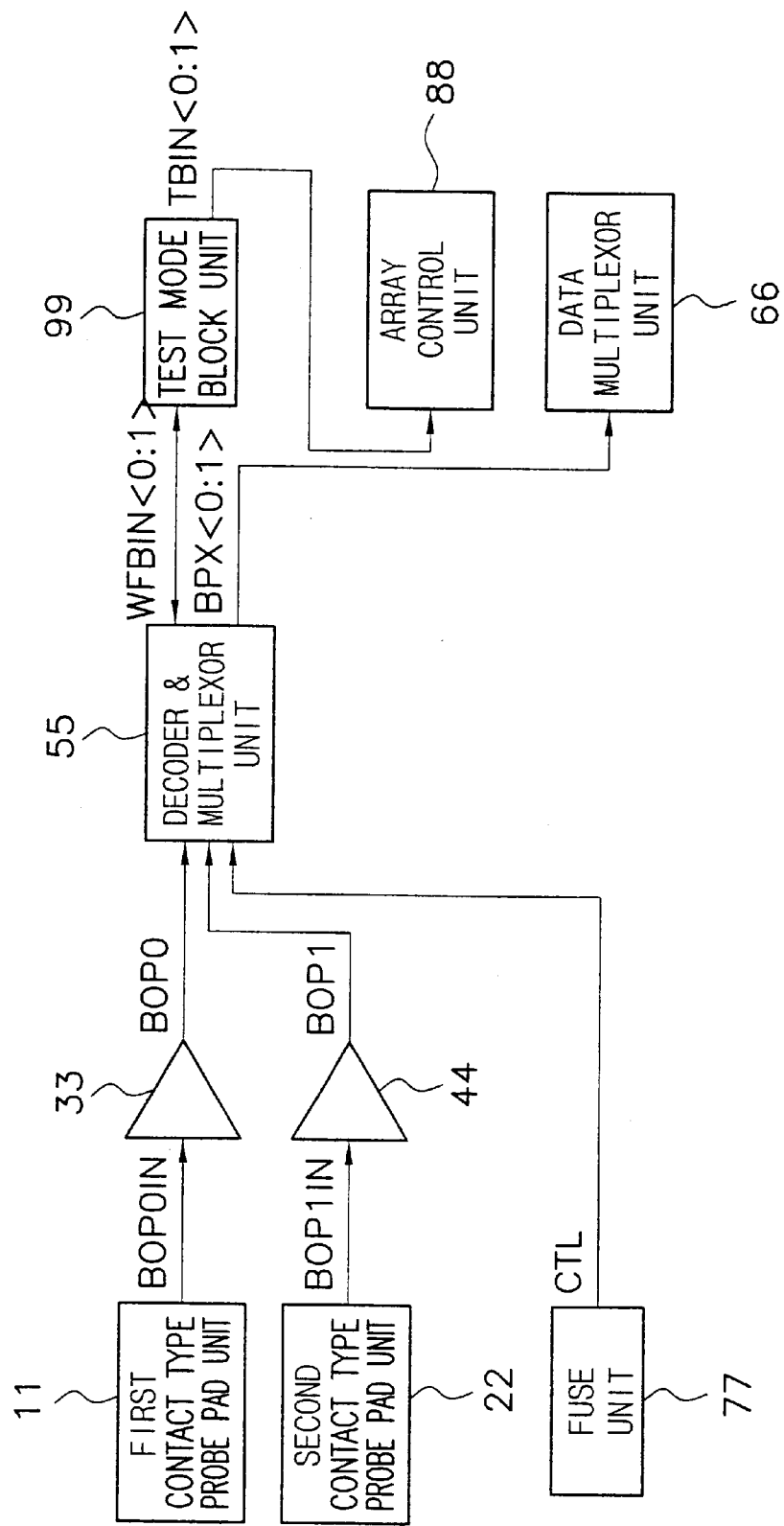
FIG. 4 is a block diagram illustrating a wafer burn-in test circuit in accordance with the present invention.

FIG. 4 is a block diagram illustrating a wafer burn-in test circuit in accordance with the present invention, including a first probe pad unit 11 for contact, a second probe pad unit 22 for contact, a fuse unit 77, a first buffer unit 33, a second buffer unit 44, a decoder and multiplexer unit 55, a data multiplexer unit 66, a test mode block unit 99 and an array control unit 88.

The first buffer unit 33 converts a signal BOP0IN inputted through the first probe pad unit 31 into a CMOS level, and maintains an initial state during non-contact by the first probe pad unit 11.

In the same manner, the second buffer unit 44 converts a signal BOP1IN inputted through the second probe pad unit 22 into a CMOS level, and maintains an initial state during non-contact by the second probe pad unit 22.

The fuse unit 77 generates a control signal CTL for enabling a signal generation path for a burn-in test operation of a wafer state before blowing, and a signal generation path for the operation of a bit line after the blowing.

The decoder and multiplexer unit 55 receives the control signal CTL from the fuse unit 77 and the output signals BOP0 and BOP1 from the first and second buffer units 33 and 44, generates a control signal WFBIN<0:1> for the wafer test operation before the blowing, and generates a control signal BPX<0:1> for the operation of the bit line after blowing based on the control signal CTL.

The test mode block unit 99 generates a control signal TBIN<0:1> during the wafer burn-in test mode based on the control signal WFBIN<0:1> from the decoder and multiplexer unit 55. The array control unit 88 controls bit lines, word lines and plate lines making up an access transistor (not shown) of a memory cell based on the control signal TBIN<0:1> from the test mode block unit 99, thereby applying a stress voltage to the cell, bit line and storage node.

The data multiplexer unit 66 controls input/output of a desired data bit based on the control signal BPX<0:1> from the decoder and multiplexer unit 55.

Figure 5:
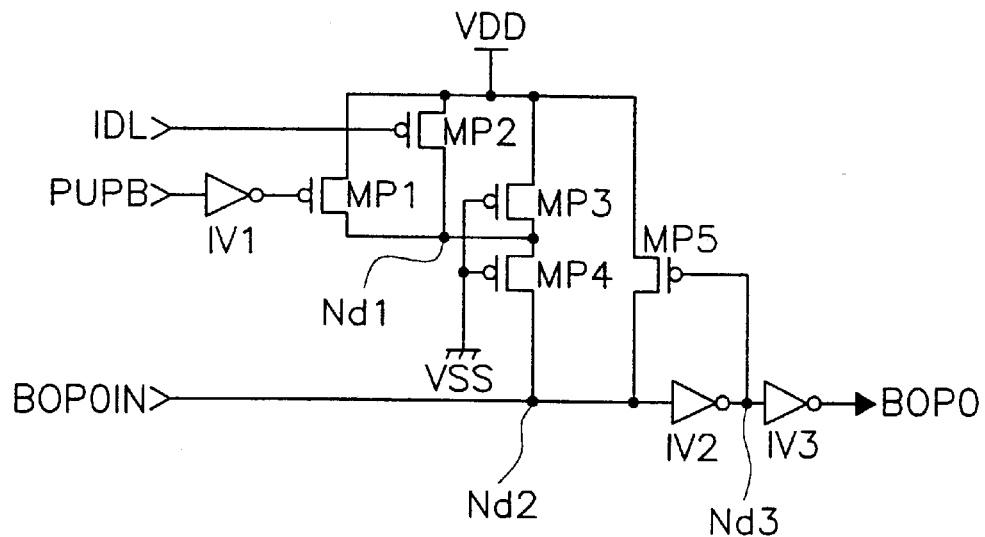
FIG. 5 is a circuit diagram illustrating a buffer unit of the circuit of FIG. 4.

FIG. 5 is a circuit diagram illustrating the first buffer unit 33 of the circuit of FIG. 4. The first buffer unit 33 includes: a PMOS transistor MP1 for transmitting a power voltage VDD to a node Nd1 when a power-up signal PUPB has a high state; a PMOS transistor MP2 for transmitting the power voltage VDD to the node Nd1 when an initialization signal IDL has a low state; a PMOS transistor MP3 for transmitting the power voltage VDD to the node Nd1 based on a ground voltage VSS; a PMOS transistor MP4 for transmitting the signal of the node Nd1 to a node Nd2 transmitting the signal BOP0IN from the first probe pad unit 11 based on the ground voltage VSS; an inverter IV2 for receiving the signal of the node Nd2, and outputting an inverted signal to a node Nd3; a PMOS transistor MP5 for transmitting the power voltage VDD to the node Nd2 based on the signal of the node Nd3; and an inverter IV3 for receiving the signal of the node Nd3, and outputting an inverted signal BOP0.

When the wafer has a pre-contact state, the first probe pad unit 11 has a floating state. Here, when the power-up signal PUPB has a high state, the power voltage VDD is supplied to the node Nd1 through the PMOS transistors MP1 and MP3, and the signal of the node Nd1 is transmitted to the node Nd2 through the PMOS transistor MP4. Therefore, the signal BOP0IN of the node Nd2 has a high state during the power-up operation, and the output signal BOP0 has a high state. That is, the first buffer unit 33 maintains the initial state during non-contact by the first probe pad unit 11.

The second buffer unit 44 of FIG. 4 has the same constitution and operation as the first buffer unit 33 of FIG. 5. Accordingly, the input signal BOP1IN of the second buffer unit 44 has a high state during the power-up operation, and the output signal BOP1 has a high state. Identically, the second buffer unit 44 serves to maintain the initial state during non-contact by the second probe pad unit 22.

Figure 6:
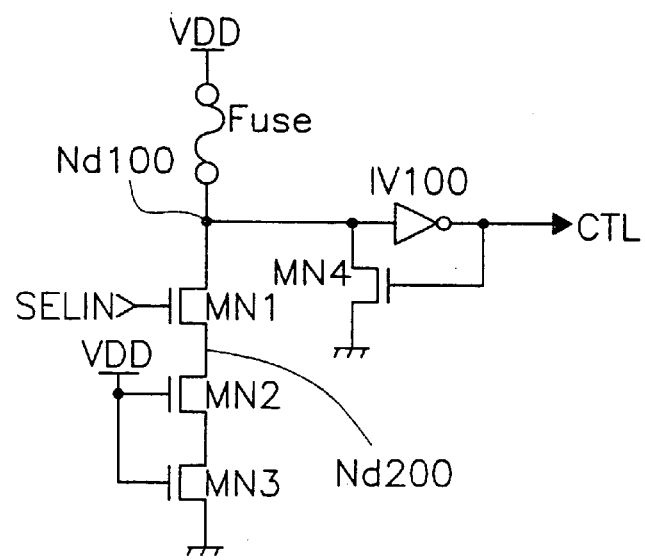
FIG. 6 is a circuit diagram illustrating a fuse unit of the circuit of FIG. 4.

FIG. 6 is a circuit diagram illustrating the fuse unit 77 of the circuit of FIG. 4. The fuse unit 77 includes: a fuse connected between the power voltage VDD and a node Nd100; an NMOS transistor MN1 for transmitting the signal of the node Nd100 to a node Nd200 based on an enable signal SELIN; NMOS transistors MN2 and MN3 connected in series between the node Nd200 and the ground voltage VSS, for discharging the signal of the node Nd200 to the ground voltage VSS based on the power voltage VDD applied to gates thereof; an inverter IV100 for receiving the signal of the node Nd2, and outputting an inverted control signal CTL; and an NMOS transistor MN4 for discharging the signal of the node Nd100 to the ground voltage VSS based on the control signal CTL.

Firstly, since the wafer has a pre-blown state, the node Nd100 has a high state based on the power voltage VDD supplied through the fuse, and the control signal CTL which is the output signal has a low state.

When the control signal CTL has a low state, the decoder and multiplexer unit 55 intercepts the path for operating the bit line, and generates the signal for the wafer burn-in test operation.

Figure 7:
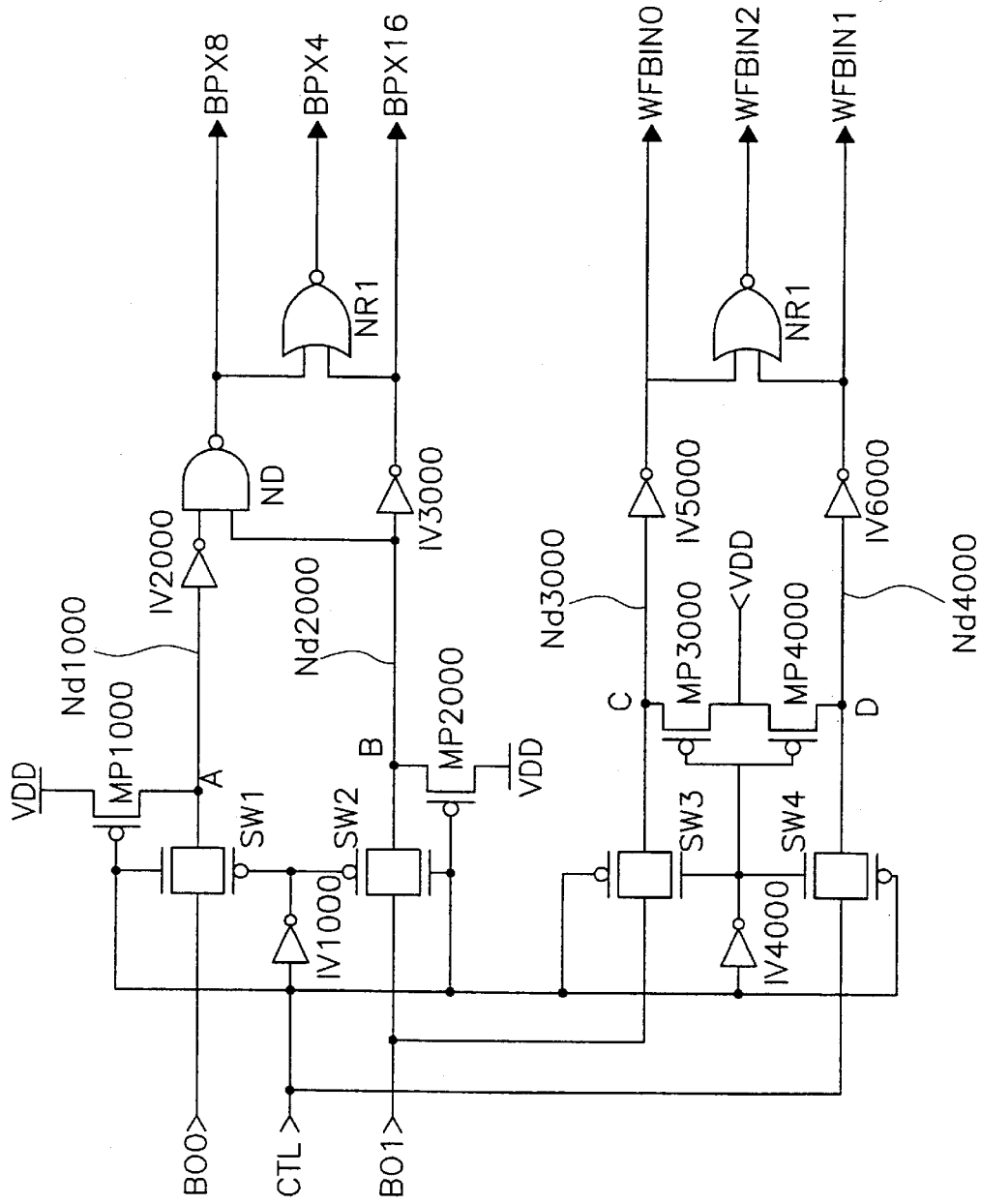
FIG. 7 is a circuit diagram illustrating a decoder and multiplexer unit of the circuit of FIG. 4.

FIG. 7 is a circuit diagram illustrating the decoder and multiplexer unit 55 of the circuit of FIG. 4. The decoder and multiplexer unit 55 includes: a transmission gate SW1 for transmitting the signal BOP0 from the first buffer unit 33 to a node Nd1000 when the output signal CTL from the fuse unit 77 has a high state; a PMOS transistor MP1000 for transmitting the power voltage VDD to the node Nd1000 when the output signal CTL from the fuse unit 77 has a low state; an inverter IV2000 for inverting and outputting the signal of the node Nd1000; a transmission gate SW2 for transmitting the signal BOP1 from the second buffer unit 44 to a node Nd2000 when the output signal CTL from the fuse unit 77 has a high state; a PMOS transistor MP2000 for transmitting the power voltage VDD to the node Nd1000 when the output signal CTL from the fuse unit 77 has a low state; an inverter IV3000 for inverting the signal of the node Nd2000, and generating a control signal BPX16; a NAND gate ND for receiving the output signal from the inverter IV2000 and the signal of the node Nd2000, and outputting a control signal BPX8; and a NOR gate NR1 for receiving the control signal BPX8 and the control signal BPX16, and generating a control signal BPX4. In addition, the decoder and multiplexer unit 55 further includes: a transmission gate SW3 for transmitting the signal BOP1 from the second buffer unit 44 to a node Nd3000 when the output signal CTL from the fuse unit 77 has a low state; a PMOS transistor MP3000 for transmitting the power voltage VDD to the node Nd3000 when the output signal CTL from the fuse unit 77 has a high state; an inverter IV5000 for inverting the signal of the node Nd3000, and outputting a control signal WFBIN0; a transmission gate SW4 for transmitting the signal BOP0 from the first buffer unit 33 to a node Nd4000 when the output signal CTL from the fuse unit 77 has a low state; a PMOS transistor MP4000 for transmitting the power voltage VDD to the node Nd4000 when the output signal CTL from the fuse unit 77 has a high state; an inverter IV6000 for inverting the signal of the node Nd4000, and generating a control signal WFBIN1; and a NOR gate NR2 for receiving the output signals from the inverters IV5000 and IV6000, and generating a control signal WFBIN2.

Since the output signal CTL from the fuse unit 77 has a low state before blowing the wafer, the transmission gates SW1 and SW2 are turned off, so as not to generate the control signals BPX8, BPX4 and BPX16 for controlling the operation of the data multiplexer unit 66. However, the transmission gates SW3 and SW4 are turned on, to receive the signals BOP0 and BOP1 from the first and second buffer units 33 and 44 and to generate the control signals WFBIN, WFBIN1 and WFBIN2 to the test mode block unit 99. Accordingly, the test mode block unit 99 controls the array control unit 88 based on the control signals WFBIN, WFBIN1 and WFBIN2 from the decoder and multiplexer unit 55, thereby performing a desired wafer burn-in test operation. That is, the array control unit 88 controls the bit lines, word lines and plate lines making up the access transistor of the memory cell based on the control signal TBIN<0:1> from the test mode block unit 99, and applies a stress to the cell, bit line and storage node, thereby executing the wafer burn-in test operation.

On the other hand, when the fuse is blown after the probe test of the wafer state, the output signal CTL from the fuse unit 77 has a high state, and the transmission gates SW3 and SW4 are turned off, thereby disabling the control signals WFBIN, WFBIN1 and WFBIN2. Therefore, the wafer burn-in test operation is not performed. In the case that the output signal CTL from the fuse unit 77 has a high state, the transmission gate SW3 and SW4 are turned on, and thus the control signals BPX8, BPX4 and BPX16 are generated based on a contact property of the probe pad. As a result, data input/output of the bit line is performed by the data multiplexer unit 66.

As discussed earlier, in accordance with the present invention, the wafer burn-in test and the wafer test circuit can cut down packaging expenses and improve F/T yield, by screening an inferior chip before packaging by executing the wafer burn-in test with the fuse and the probe pad for contact prior to the contact. Moreover, an additional probe pad for the wafer burn-in test is not required, so that chip area is reduced.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are intended to be embraced by the appended claims.

What is claimed is:

1. A wafer burn-in test circuit for a semiconductor memory device, comprising:
   a bonding probe pad unit having a floating state in non-bonding before blowing a wafer;
   a buffer unit for initializing an input signal inputted through the bonding probe pad unit having a floating state during non-contact before blowing a wafer, converting the signal into a CMOS level, and outputting the converted signal;
   a fuse unit for generating a first control signal for selecting a signal generation path for a test operation of a wafer state before blowing the wafer, and a signal generation path for an operation of a bit line after blowing the wafer;
   a multiplexer unit for receiving the first control signal from the fuse unit and the output signal from the buffer unit, generating a second control signal for the wafer test operation before blowing the wafer, and generating a third control signal for the operation of the bit line after blowing the wafer according to the first control signal; and
   a decoder unit for receiving the output signal from the multiplexer unit, and generating a decoded signal.

* * * * *